(12) United States Patent
Sheppard et al.

(10) Patent No.: US 9,711,633 B2
(45) Date of Patent: Jul. 18, 2017

(54) METHODS OF FORMING GROUP III-NITRIDE SEMICONDUCTOR DEVICES INCLUDING IMPLANTING IONS DIRECTLY INTO SOURCE AND DRAIN REGIONS AND ANNEALING TO ACTIVATE THE IMPLANTED IONS

(75) Inventors: Scott T. Sheppard, Chapel Hill, NC (US); R. Peter Smith, Carrboro, NC (US); Yifeng Wu, Goleta, CA (US); Sten Heikman, Goleta, CA (US); Matthew Jacob-Mitos, Santa Barbara, CA (US)

(73) Assignee: Cree, Inc., Durham, NC (US)

(*) Notice: Subject to any disclaimer, the term of this patent is extended or adjusted under 35 U.S.C. 154(b) by 1243 days.

(21) Appl. No.: 12/118,243

(22) Filed: May 9, 2008

(65) Prior Publication Data

US 2011/0057232 A1    Mar. 10, 2011

(51) Int. Cl.
| | | |
|---|---|---|
| H01L 21/338 | (2006.01) |
| H01L 29/778 | (2006.01) |
| H01L 29/08 | (2006.01) |
| H01L 29/66 | (2006.01) |
| H01L 23/29 | (2006.01) |
| H01L 23/31 | (2006.01) |
| H01L 29/20 | (2006.01) |

(52) U.S. Cl.
CPC ...... *H01L 29/7787* (2013.01); *H01L 29/0843* (2013.01); *H01L 29/66462* (2013.01); *H01L 23/291* (2013.01); *H01L 23/3171* (2013.01); *H01L 29/2003* (2013.01); *H01L 2924/0002* (2013.01)

(58) Field of Classification Search
USPC .............. 439/167, 172, 175, 181, 184; 257/E21.403
See application file for complete search history.

(56) References Cited

U.S. PATENT DOCUMENTS

| | | | |
|---|---|---|---|
| 6,297,538 B1 * | 10/2001 | Kolodzey et al. | 257/410 |
| 6,316,793 B1 | 11/2001 | Sheppard et al. | |
| 6,686,616 B1 * | 2/2004 | Allen et al. | 257/280 |

(Continued)

FOREIGN PATENT DOCUMENTS

| | | |
|---|---|---|
| JP | 01-302866 A | 12/1989 |
| JP | H0245976 A | 2/1990 |

(Continued)

OTHER PUBLICATIONS

S. Wolf et al. Silicon processing for the VLSI Era, Lattice Press 1986, vol. 1, p. 194.*

(Continued)

*Primary Examiner* — Anh Mai
(74) *Attorney, Agent, or Firm* — Myers Bigel, P.A.

(57) ABSTRACT

Methods of forming a semiconductor device include forming a dielectric layer on a Group III-nitride semiconductor layer, selectively removing portions of the dielectric layer over spaced apart source and drain regions of the semiconductor layer, implanting ions having a first conductivity type directly into the source and drain regions of the semiconductor layer, annealing the semiconductor layer and the dielectric layer to activate the implanted ions, and forming metal contacts on the source and drain regions of the semiconductor layer.

24 Claims, 8 Drawing Sheets

(56) References Cited

U.S. PATENT DOCUMENTS

| | | | |
|---|---|---|---|
| 7,045,404 B2* | 5/2006 | Sheppard et al. | 438/191 |
| 7,476,594 B2* | 1/2009 | Suvorov | 438/407 |
| 7,786,509 B2* | 8/2010 | Mishima et al. | 257/194 |
| 2003/0075719 A1* | 4/2003 | Sriram | 257/77 |
| 2004/0099888 A1* | 5/2004 | Sriram | 257/288 |
| 2005/0258451 A1* | 11/2005 | Saxler et al. | 257/192 |
| 2007/0158683 A1 | 7/2007 | Sheppard et al. | |
| 2007/0269968 A1* | 11/2007 | Saxler et al. | 438/522 |

FOREIGN PATENT DOCUMENTS

| | | | | |
|---|---|---|---|---|
| JP | 2003 209067 A | | 7/2003 | |
| JP | 2004 288853 A | | 10/2004 | |
| JP | 2005-116858 | * | 4/2005 | H01L 21/338 |
| JP | 2006 222160 A | | 8/2006 | |
| JP | 2007-189213 A | | 7/2007 | |
| JP | 2007 305630 A | | 11/2007 | |
| JP | 2009-537983 A | | 10/2009 | |
| WO | WO 2007/136519 A1 | | 11/2007 | |

OTHER PUBLICATIONS

U.S. Appl. No. 11/286,805, filed Nov. 23, 2005, Cree, Inc.
Fellows et al. "Electrical activation studies of GaN implanted with Si from low to high dose" *Applied Physics Letters* vol. 80, No. 11: 1930-1932 Mar. 18, 2002.
Irokawa et al. "Activation characteristics of ion-implanted $Si^+$ in AlGaN" *Applied Physics Letters* 86:192102-1-192102-3 (2005).
Kucheyev et al. "Ion implantation into GaN" Reports: A Review Journal *Materials Science and Engineering*, 33: 51-107 (2001).
Matsunaga et al. "Silicon implantation in epitaxial GaN layers: Encapsulant annealing and electrical properties" *Journal of Applied Physics* vol. 95, No. 5: 2461-2466 Mar. 1, 2004.
Qiao et al. Low resistance ohmic contacts on AlGaN/GaN structures using implantation and the "advancing" Al/Ti metallization *Applied Physics Letters* vol. 74, No. 18:2652-2654 May 3, 1999.
Recht et al. "Nonalloyed Ohmic Contacts in AlGaN/GaN HEMTs by Ion Implantation With Reduced Activation Annealing Temperature" *IEEE Electron Device Letters*, vol. 27, No. 4: 205-207 Apr. 4, 2006.
Ryu et al. "High electrical activation efficiency obtained from Si-implanted $Al_{0.18}Ga_{0.82}N$" *Journal of Applied Physics* vol. 96, No. 11: 6277-6280 Dec. 1, 2004.
Yu et al. "Dopant activation and ultralow resistance ohmic contacts to Si-ion-implanted GaN using pressurized rapid thermal annealing" *Applied Physics Letters*, vol. 85, No. 22: 5254-5256 Nov. 29, 2004.
Japanese Office Action Corresponding to Japanese Patent Application No. 2009-089272; Mailing Date: Jul. 10, 2012; Foreign Text, 4 Pages, English Translation Thereof, 6 Pages.
Japanese Office Action Corresponding to Japanese Patent Application No. 2009-089272; Mailing Date: May 7, 2013; Foreign Text, 2 Pages, English Translation Thereof, 2 Pages.

* cited by examiner

METHODS OF FORMING GROUP III-NITRIDE SEMICONDUCTOR DEVICES INCLUDING IMPLANTING IONS DIRECTLY INTO SOURCE AND DRAIN REGIONS AND ANNEALING TO ACTIVATE THE IMPLANTED IONS

STATEMENT OF U.S. GOVERNMENT INTEREST

This invention was made with Government support under Contract No. 4400121759 awarded by the Defense Advanced Research Projects Agency. The Government has certain rights in the invention.

BACKGROUND

The present invention relates to semiconductor devices and, more particularly, to semiconductor devices that include implanted regions and related methods.

There is a high level of interest in wide bandgap semiconductor materials such as silicon carbide (2.996 eV for alpha SiC at room temperature) and the Group III nitrides (e.g., 3.36 eV for GaN at room temperature) for high power, high temperature and/or high frequency applications. These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. In addition, a major portion of the electrons in the 2DEG is attributed to polarization in the AlGaN.

U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

In order to provide desired semiconductor properties, it is frequently desirable to dope a semiconductor layer with impurity atoms (i.e. dopants). Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards a target layer, where they become implanted. The number of ions directed at a target layer is referred to as the dose, which is typically expressed in ions/cm$^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth (i.e., the "implant range").

Ion implantation is useful for selective doping of crystalline material in order to form desired regions in the material, such as p-n junctions, highly conductive contact regions, field spreading regions, etc. Typically, after impurities are implanted into a semiconductor layer, it is desirable to anneal the implanted impurities at a high temperature, i.e. a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

In nitride-based HEMT device structures, the source and drain regions are typically formed as implanted regions. However, the anneal conditions (e.g., temperature and/or duration of anneal) used to activate the implanted dopants may be harmful to the nitride epitaxial layers of the device. Thus, for example, devices may exhibit increased sheet resistance in their channel regions following the activation anneal.

SUMMARY

Methods of forming a semiconductor device according to some embodiments include fowling a dielectric layer on a Group III-nitride semiconductor layer, selectively removing portions of the dielectric layer over spaced apart source and drain regions of the semiconductor layer, implanting ions having a first conductivity type directly into the source and drain regions of the semiconductor layer, annealing the semiconductor layer and the dielectric layer to activate the implanted ions, and forming metal contacts on the source and drain regions of the semiconductor layer.

The ions may be implanted at an implant energy less than about 80 keV and a dose of about $8 \times 10^{14}$ ions/cm$^2$ to about $1 \times 10^{16}$ ions/cm$^2$.

The implantation energy may be selected to provide a peak implant concentration near an interface of the semiconductor layer and a channel layer underlying the semiconductor layer. In particular, the peak implant concentration may be within about 100 Å of the interface of the semiconductor layer and the channel layer.

The peak implant concentration may be greater than about $1\times10^{20}$ cm$^{-3}$. In some embodiments, the peak implant concentration may be greater than about $3\times10^{20}$ cm$^{-3}$.

Forming the metal contacts may include forming a mask over the dielectric layer and the source and drain regions, selectively removing portions of the mask to expose respective source and drain contact regions of the source and drain regions, depositing a metal on the source and drain contact regions, and removing the mask.

The source and drain contact regions may be spaced apart from the dielectric layer by about 0.1 to 1 µm.

The dielectric layer may include a first dielectric layer, and the methods may further include forming a second dielectric layer over the first dielectric layer after implanting the source and drain regions, and selectively removing portions of the second dielectric layer in the source and drain regions to expose respective source and drain contact regions in the source and drain regions.

The methods may further include forming source and drain contacts in the source and drain contact regions, and the source and drain contacts may be in direct contact with the second dielectric layer. In some embodiments, the source and drain contacts may be spaced apart from the second dielectric layer by about 0.1 to about 1 µm.

The methods may further include annealing the source and drain contacts at a temperature of about 450° C. to about 700° C.

The dielectric layer may include SiN. Annealing the semiconductor layer and the dielectric layer may include annealing in an atmosphere containing NH3.

Annealing the semiconductor layer and the dielectric layer may include annealing at a temperature of from about 1000° C. to about 1300° C. Annealing the semiconductor layer and the dielectric layer may further include annealing in NH$_3$ and SiH$_4$ so that SiN is formed on the dielectric layer during the anneal.

Fanning the dielectric layer may include forming the dielectric layer using Chemical Vapor Deposition (CVD) at a temperature greater than about 700° C. For example, forming the dielectric layer may include forming the dielectric layer at a temperature of about 900° C. to about 1000° C.

The methods may further include removing the first dielectric layer, forming a second dielectric layer on the semiconductor layer, selectively removing portions of the second dielectric layer over spaced apart source and drain contact regions of the semiconductor layer, and forming metal contacts on the source and drain contact regions of the semiconductor layer. The source and drain contacts may be spaced apart from the second dielectric layer by about 0.1 to 1 µm. The second dielectric layer may include SiN.

The ions may be implanted at an implant energy less than about 80 keV and a dose of about $8\times10^{14}$ ions/cm$^2$ to about $1\times10^{16}$ ions/cm$^2$.

Forming the metal contacts may include forming a mask over the second dielectric layer and the source and drain regions, selectively removing portions of the mask to expose the source and drain contact regions, depositing a metal on the source and drain contact regions, and removing the mask.

A transistor device according to some embodiments includes a Group III-nitride semiconductor layer including an upper surface and spaced apart source and drain regions in the upper surface, a dielectric protective layer on the upper surface of the semiconductor layer, and a gate contact on a surface of the dielectric protective layer opposite the Group-III nitride semiconductor layer and extending through the dielectric protective layer to contact the Group-III nitride semiconductor layer. A distribution of implanted dopants is within the source and drain regions of the semiconductor layer, and source and drain ohmic contacts on the source and drain regions, respectively, of the semiconductor layer. The source and drain ohmic contacts may be spaced apart laterally from the dielectric protective layer by about 0.1 µm to about 1 p.m.

The Group-III-nitride semiconductor layer may include a barrier layer, and the device may further include a channel layer on the barrier layer opposite the gate contact. The distribution of implanted dopants has a peak concentration near an interface of the channel layer and the barrier layer.

The transistor device may further include a dielectric layer on the dielectric protective layer, and the source and drain ohmic contacts may be in direct contact with the dielectric layer.

The distribution of implanted dopants may have a peak implant concentration within about 100 Å of an interface between the semiconductor layer and a channel layer underlying the semiconductor layer.

The dielectric protective layer may be self-aligned to the source and drain regions.

Methods of forming a semiconductor device according to further embodiments include forming a first silicon nitride layer on a Group III-nitride semiconductor layer, selectively removing portions of the first silicon nitride layer over spaced apart source and drain regions of the semiconductor layer, and implanting ions having a first conductivity type directly into the source and drain regions of the semiconductor layer. The first silicon nitride layer and the dielectric layer are annealed to activate the implanted ions. The methods further include removing the first silicon nitride layer, forming a second silicon nitride layer on the Group III-nitride semiconductor layer, selectively removing portions of the second silicon nitride layer over spaced apart source and drain contact regions of the semiconductor layer, and forming metal contacts on the source and drain contact regions of the semiconductor layer. The metal contacts are annealed, and a via is etched through the second silicon nitride layer. A gate contact is formed in the via.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
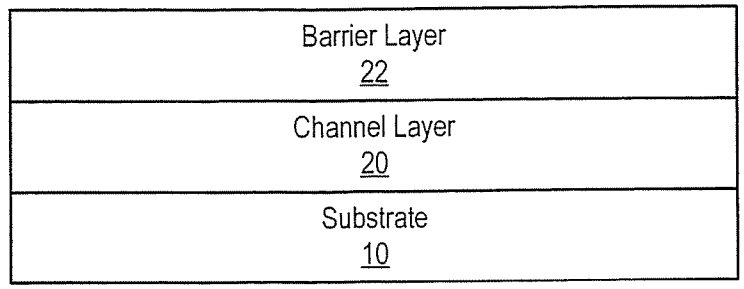
FIGS. 1A-1E are cross-sectional views illustrating fabrication of a transistor according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to forom binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described in connection with GaN HEMT devices, the present invention may be employed in connection with other types of devices and/or materials. For example, embodiments of the invention may also be particularly suited for use in silicon carbide MESFET devices. Likewise, some embodiments of the invention may be advantageously employed in GaN-based light emitting devices (LEDs), as well as in GaAs-based devices such as GaAs/AlGaAs pHEMT devices.

Embodiments of the present invention utilize a protective layer during implantation of dopant atoms into a semiconductor layer, for example, to provide highly doped source/drain regions of a transistor. The protective layer may remain on the structure during an anneal to activate the implanted dopant atoms to protect the surface of the semiconductor layer. The protective layer may further remain on the semiconductor layer to act as a passivation layer for the semiconductor layer in the completed device.

Fabrication of structures according to embodiments of the present invention is schematically illustrated in FIGS. 1A-1F. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is formed on the substrate 10. The channel layer 20 may be formed on the substrate 10 using buffer layers, transition layers, and/or nucleation layers as described above. The channel layer 20 may be under compressive strain. Furthermore, the channel layer and/or buffer nucleation and/or transition layers may be epitaxially grown by metal-organic chemical vapor deposition (MOCVD) or by other techniques known to those of skill in the art, such as molecular beam epitaxy (MBE), hydride vapor phase epitaxy (HVPE) or other suitable techniques.

In some embodiments of the present invention, the channel layer 20 is a Group III-nitride, such as $Al_xGa_{1-x}N$ where $0 \leq x < 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also include other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is formed on the channel layer 20. The barrier layer 22 may have a bandgap that is greater than the bandgap of the channel layer 20 and the barrier layer 22 may also have a smaller electron affinity than the channel layer 20. The barrier layer 22 may be epitaxially gown directly on the channel layer 20. In certain embodiments of the present invention, the barrier layer 22 includes AlN, AlInN, AlGaN and/or AlInGaN with a thickness of between about 0.1 nm and about 10 nm. In some embodiments, the barrier layer may include $Al_xGa_{1-x}N$ where $0 \leq x < 0.32$. In particular embodiments, x=0.22.

While embodiments of the present invention are described herein with reference to particular HEMT structures, the present invention should not be construed as limited to such structures. For example, additional layers may be included in the HEMT device while still benefiting from the teachings of the present invention. Such additional layers may include a GaN cap layer on the barrier layer. Furthermore, the barrier layer 22 may also be provided with multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In particular embodiments of the present invention, the barrier layer 22 is thick enough and has a high enough Al composition and doping to induce a significant carrier concentration at the interface between the channel layer 20 and the barrier layer 22 through polarization effects when the barrier layer 22 is buried under ohmic contact metal. Also, the barrier layer 22 should be thick enough to reduce or minimize scattering of electrons in the channel due to ionized impurities deposited at the interface between the barrier layer 22 and a dielectric layer 24 (FIG. 1B).

As noted above, the barrier layer 22 may have a bandgap larger than that of the channel layer 20 and a smaller electron affinity than the channel layer 20. Accordingly, in certain embodiments of the present invention, the barrier layer 22 may include AlGaN, AlInGaN and/or AlN or combinations of layers thereof. The barrier layer 22 should not be so thick as to cause cracking or substantial defect formation therein. In certain embodiments of the present invention, the barrier layer 22 is undoped or doped with an n-type dopant to a concentration less than about $1 \times 10^{19}$ cm$^{-3}$. In some embodiments of the present invention, the barrier layer 22 includes $Al_xGa_{1-x}N$ where $0 < x \leq 1$. In particular embodiments, the aluminum concentration may be about 25%. However, in other embodiments of the present invention, the barrier layer 22 comprises AlGaN with an aluminum concentration of between about 5% and about 100%. In some embodiments of the present invention, the aluminum concentration is greater than about 10%.

Figure 1B:
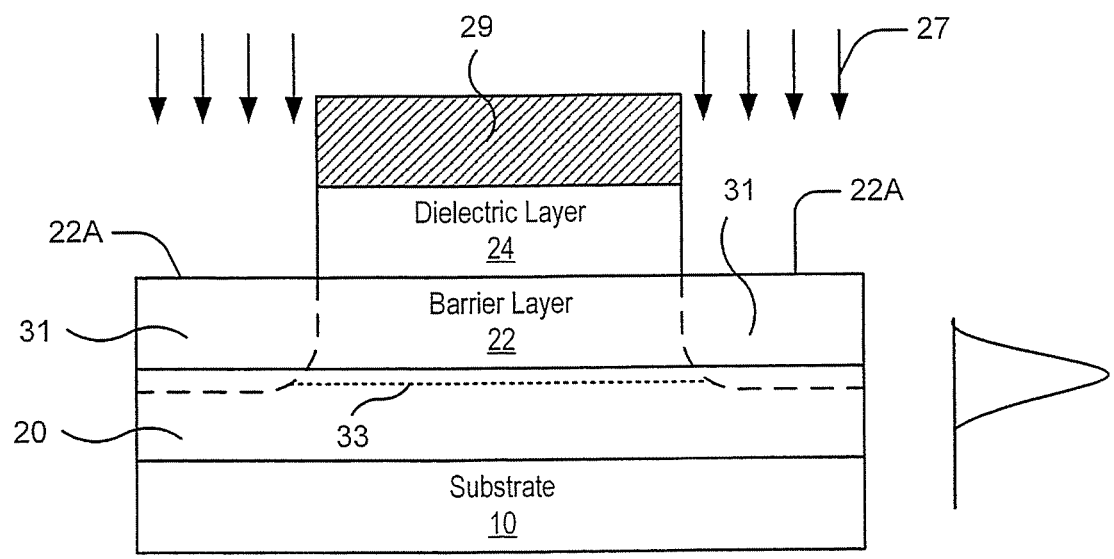

As shown in FIG. 1B, a dielectric layer 24 is formed on the barrier layer 22. The dielectric layer 24 may include silicon nitride ($Si_xN_y$), silicon dioxide ($SiO_2$), AlSiN, and/or another suitable dielectric material, such as silicon oxynitride (SiON). It will be understood that the terms "$Si_xN_y$," "SiN" and "silicon nitride" are used herein interchangeably to refer to both stoichiometric and non-stoichiometric silicon nitride. Other materials may also be utilized for the dielectric layer 24. For example, the dielectric layer 24 could also include magnesium oxide, scandium oxide, aluminum oxide and/or aluminum oxynitride. Furthermore, the dielectric layer 24 may be a single layer or may include multiple layers of uniform and/or non-uniform composition. The material of the dielectric layer 24 should be capable of withstanding relatively high temperatures, and should be capable of being removed without significantly damaging the underlying barrier layer 22.

In general, the dielectric layer 24 may be a dielectric layer that has a relatively high breakdown field strength and that provides a relatively low interface trap density at the interface with an underlying Group III-nitride layer such as the barrier layer 22. The dielectric layer 24 may have a high etch selectivity with respect to the material of the barrier layer 22, and may not be reactive to the material of the barrier layer 22. Moreover, the dielectric layer 24 may have a relatively low level of impurities therein. For example, the dielectric layer 24 may have a relatively low level of hydrogen and other impurities, including oxygen, carbon, fluorine and chlorine. In addition, the dielectric layer 24 may be stable at relatively high temperatures (e.g. >1000° C.) in order to withstand high annealing temperatures used in subsequent process steps.

In particular embodiments of the present invention, the dielectric layer 24 includes SiN. The SiN dielectric layer 24 may be formed, for example, by Chemical Vapor Deposition (CVD). The SiN dielectric layer 24 may be stoichiometric (i.e. the ratio of silicon to nitrogen in the material is about 3:4). The stoichiometry of a SiN layer may be adjusted, for example, by adjusting the relative flow rates of $SiH_4$ and $NH_3$ source gases in a CVD process. Moreover, when formed at relatively high temperatures, CVD-grown SiN tends to be stoichiometric.

The stoichiometry of a SiN layer may also affect the index of refraction of the layer. In certain embodiments of the present invention, a SiN dielectric layer 24 may have an index of refraction at a 633 nm wavelength of from about 1.6 to about 2.2. In particular embodiments, the index of refraction of a SiN dielectric layer 24 is 1.98±0.05 as measured by ellipsometry. Stoichiometric SiN may also be characterized by its etch rate in a buffered oxide etch (BOE). For example, the etch rate of stoichiometric SiN in BOE is nearly zero.

In some embodiments, the dielectric layer 24 may be $SiO_2$. The $SiO_2$ may be formed by LPCVD and/or MOCVD and may be stoichiometric. In certain embodiments of the present invention, an $SiO_2$ protective layer may have an index of refraction at a 633 nm wavelength of from about 1.36 to about 1.56. In particular embodiments, the index of refraction of an $SiO_2$ protective layer is 1.46±0.03 as measured by ellipsometry.

When the dielectric layer 24 includes silicon nitride, the dielectric layer 24 should have impurity levels at or below the levels shown in Table 1, as measured by secondary ion mass spectroscopy (SIMS) with a Cs ion beam.

TABLE 1

| Element | Concentration (cm$^{-3}$) |
|---|---|
| H | $4 \times 10^{21}$ |
| O | $3 \times 10^{18}$ |
| C | $7 \times 10^{17}$ |
| F | $1 \times 10^{16}$ |
| Cl | $4 \times 10^{16}$ |

The dielectric layer 24 may be blanket deposited on the barrier layer 22 and subsequently patterned as described below. Typically, the dielectric layer 24 may have a thickness in the range of about 100 nm, however, other thickness layers may also be utilized. For example, the dielectric layer should be sufficiently thick so as to protect the underlying layer during a subsequent anneal of ohmic contacts and/or implanted dopants. Layers as thin as two or three monolayers may be sufficient for such purposes. However, in general, the dielectric layer 24 may have a thickness of from about 10 nm to about 500 nm.

The dielectric layer may include a high purity SiN layer as described in U.S. patent application Ser. No. 11/286,805 entitled "GROUP III NITRIDE SEMICONDUCTOR DEVICES WITH SILICON NITRIDE LAYERS AND METHODS OF MANUFACTURING SUCH DEVICES" filed Nov. 23, 2005, the disclosure of which is incorporated herein by reference as if fully set forth herein. In particular, pursuant to certain embodiments of the present invention, an in situ grown SiN dielectric layer 24 may be grown using LPCVD or MOCVD at relatively high temperatures (e.g., above about 700° C.). In particular embodiments, the SiN layers may be grown at a temperature in the range of about 900-1000° C. Such high temperature growth may also facilitate reducing the impurity levels in the SiN layer and at the interface between the barrier layer 22 and the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In some embodiments, the growth rate may be about 2 microns/hour.

Although the dielectric layer 24 can be formed ex situ, Foaming the SiN dielectric layer 24 in situ may also reduce the levels of impurities that are incorporated into the top surface of the uppermost Group III nitride layer and/or into the SiN layer itself. In particular, when the device is removed from the reactor and the SiN layer is formed via a post-MOCVD growth process such as, for example, sputtering or PECVD, a number of different mechanisms may introduce impurities. For example, if hydrogen is present in an MOCVD reactor during the growth of a Group III nitride layer, the hydrogen may tend to incorporate into the Group III nitride layer during cooling of the reactor following growth. Likewise, exposure of the device to the atmosphere upon removal from the reactor may allow for incorporation of oxygen atoms, and various other impurities may be introduced, particularly adjacent the outer surfaces of the device, as a result of handling of the device and/or chemical cleaning of the device. Impurities may also be added if post-growth processing such as wet etching, electrode deposition, annealing steps, etc. are performed prior to deposition of the SiN protective/passivation layer. These impurities may change the surface states at the interface between the Group III nitride layer and the SiN layer in ways that may be undesirable and/or difficult to control/reproduce. For example, the presence of impurities can increase trapping at the interface between the SiN layer and the underlying Group III nitride layer, thereby potentially increasing the sheet resistance of the channel.

In some embodiments of the present invention, high purity silane ($SiH_4$) may be used as a source gas in the growth of the SiN layer(s). As is known to persons of skill in the art, silane is often used as a source for silicon dopants in the growth of n-doped Group III nitride layers. Typically, diluted silane gas is used in such applications as it is less expensive and easier to use than pure silane, which may be highly combustible. The use of such pure silane may facilitate reducing the level of impurities at, for example, the interface between the Group III nitride layer and the SiN layer and/or within the SiN layer, which may, in certain circumstances, improve the performance and/or reproducibility of the device. In particular, the higher quality (i.e., more pure) SiN layer may help reduce or minimize trapping within the body of the insulative layer, thereby providing a higher breakdown critical field. When such a pure silane gas source is included with the reactor, it may still be desirable to include a diluted silane source as well, so that diluted silane gas may be used as the dopant gas source during the growth of, for example, an n-doped or co-doped Group III nitride layer.

Referring still to FIG. 1B, the dielectric layer 24 is patterned and etched using a mask 29 to expose surface portions 22A of the barrier layer 22. The dielectric layer 24 can be etched using, for example, a low damage etch process. Examples of low damage etch techniques include etching techniques other than reactive ion etching, such as inductively coupled plasma or electron cyclotron resonance (ECR) or downstream plasma etching with no DC component to the plasma. The mask 29 may include photoresist and/or a metal, and may be patterned using conventional photolithographic/liftoff techniques.

With the mask 29 in place, impurity ions 27 are implanted into the exposed surface portions 22A of the barrier layer 22 such that at least a portion of the implanted ions come to rest within the channel layer 20. In particular, the impurity ions 27 are implanted as shallow implants. As used herein, "shallow implants" means that the implants are made directly into the barrier layer with no capping or protective layer over the barrier layer during the implantation. The implanted ions are implanted with an implant energy and/or implant dose so that the peak of the implant profile is located near the interface between the channel layer 20 and the barrier layer 22 (or shallower), which is where the two dimensional electron gas (2DEG) 33 used for conductivity modulation is formed. For example, a "shallow" implant can include an implant directly into a barrier layer at low energy in a manner that can reduce both sheet resistance ($R_{SH}$) and lateral straggle for a given dose/energy. In some embodiments, the implanted ions form a concentration profile having a peak slightly within the channel layer 20 (e.g., within about 100 Å of the interface between the channel layer 20 and the barrier layer 22). Accordingly, as shown in FIG. 1B, implanted source/drain regions 31 may be formed partially within the barrier layer 22 and partially within the channel layer 20.

As further shown in FIG. 1B, since the source/drain regions 31 may be implanted using the same mask that was used to pattern the dielectric layer 24 or using the patterned dielectric layer 24 as an implantation mask, the dielectric layer 24 may be self-aligned to the source/drain regions 31.

The implant conditions may be selected to provide implanted source/drain regions 31 having a peak dopant concentration of $1 \times 10^{18}$ cm$^{-3}$ or greater and a straggle of 50 nm or less. For example, in some embodiments, the dose and energy of the implants may be selected to provide a peak dopant concentration of about $5 \times 10^{19}$ cm$^{-3}$ and a straggle of about 30 nm.

In some embodiments, the implants may be performed at room temperature. The implant energy and dose may be selected to provide an implant profile that achieves a desired sheet resistivity and/or permits fabrication of low resistivity ohmic contacts to the barrier layer 22. In order to form n-type implanted source/drain regions 31 in a nitride-based layer, the implanted ions may include silicon, sulfur and/or oxygen ions. In some embodiments, the implantation may include a single implant step at an energy of about 40 to about 80 keV and a dose of $8 \times 10^{14}$ to $1 \times 10^{16}$ cm$^{-2}$. In particular embodiments, the implantation may include a single implant step at an energy of about 50 keV and a dose of about $5 \times 10^{15}$ cm$^{-2}$. The implantation may be performed with the substrate 10 held at an angle of 7° to reduce/avoid channeling effects.

Using a single shallow implant with the implant peak near the 2DEG 33 may improve channel sheet resistance without adversely affecting the contact region in the source/drain regions 31. Although the inventors do not wish to be bound by a particular theory, it appears that a shallow implant at relatively low energy may result in less damage to the semiconductor crystal in the barrier layer 22, supporting the formation of low resistance ohmic contacts thereto.

Although a single implant is described above, the implant process may include multiple implant steps to provide a net profile of implanted dopants. For example, the implant process may include a first shallow implant step performed under a first set of implant conditions and a subsequent shallow implant step performed under a second set of implant conditions. More than two implant steps may be performed. Box profiles employing multiple energies may be used as long as the peak of the shallowest energy provides low contact resistance as with a single implant energy.

U.S. Patent Publication 2007/0158683 entitled "SEMICONDUCTOR DEVICES INCLUDING IMPLANTED REGIONS AND PROTECTIVE LAYERS AND METHODS OF FORMING THE SAME", published Jul. 12, 2007 and which is assigned to the assignee of the present invention, discloses methods of forming source/drain regions by implanting ions through a protective layer formed on the barrier layer. The protective layer remains on the device to protect the barrier layer during activation annealing. However, the implant annealing energy, dose and/or anneal conditions used to implant the dopant ions through the protective layer can cause the dopant depth profile to extend farther into the channel layer than may be desirable.

Shallow implants for source drain regions are described, for example, in F. Recht, et al., "Nonalloyed ohmic contacts in AlGaN/GaN HEMTs by ion implantation with reduced activation annealing temperature," IEEE. Electron Device Letters, vol 27, no. 4, (April 2006). The source/drain implants in the devices described by Recht et al. were annealed using a capless activation anneal (i.e. with no dielectric layer on the channel region during the activation anneal), and a SiN passivation layer was formed after implant activation anneal.

The devices of Recht et al. showed a contact resistance of 0.96 Ω-mm to the channel. However, the channel region of the devices may suffer from higher sheet resistance and/or may exhibit higher gate leakage. Furthermore, the results may be less repeatable compared to methods according to embodiments of the present invention. Use of shallow implants and protective layer during anneal can produce contact resistance values below 0.5 Ω-mm with channel sheet resistance $R_{SH}$ that are not significantly higher than as-grown $R_{SH}$.

A nitride transistor according to some embodiments of the invention includes both shallow source/drain implants and a protective dielectric layer 24 over the channel region. The dielectric layer 24, which is formed on the channel region before the implant activation anneal, may protect the channel region during subsequent high temperature processing steps (e.g. activation anneal, ohmic contact anneal, etc.). However, because the dielectric layer 24 is not formed over at least portions of the source drain regions 31 during ion implantation, shallow source/drain implants may be performed. Furthermore, the dielectric layer 24 may remain on the barrier layer throughout the fabrication process, and may remain in the completed device. In some embodiments, the dielectric layer 24 is removed after the anneal, and a second dielectric layer is formed in its place. The second dielectric layer can include deposited SiN, for example.

Thus, according to some embodiments, openings are formed in the dielectric layer 24 above the source/drain regions 31 and dopants are directly implanted through the openings. Forming the source/drain regions 31 using shallow implants can provide an electrical conduction path to the device 2D electron gas 33. That is, as a result of the direct shallow implanting of ions 27, the resistance near the interface between the source/drain regions 31 and the 2DEG 33 may be reduced. Furthermore, the protection afforded by the dielectric layer 24 during a subsequent activation anneal may provide a lower sheet resistance channel region with reduced gate leakage.

After formation of the implanted source/drain regions 31, the implants may be activated by an activation anneal. The activation anneal may be performed with the dielectric layer 24 in place. In particular, the dielectric layer 24 may protect the surface of the barrier layer 22 during the anneal.

The activation anneal may be performed in an inert atmosphere including, for example, $N_2$ and/or Ar. When the dielectric layer 24 includes SiN, the anneal atmosphere may include a partial pressure of $NH_3$ in the range of about 0.1 mbar to 1000 mbar. More particularly, the $NH_3$ may have a pressure of about 10-100 mbar. In particular, the $NH_3$ may have a pressure of about 90 mbar. The $NH_3$ may help to reduce decomposition of the SiN dielectric layer 24. The activation anneal may be performed at a temperature sufficient to activate the implanted dopant ions but less than a temperature at which the underlying semiconductor layer, i.e. the barrier layer 22, deteriorates. The presence of the dielectric layer 24 during the high temperature process steps may inhibit damage to the underlying epitaxial layers, including barrier layer 22, that may otherwise result from high temperature annealing. For example, where the barrier layer 22 includes AlGaN, the activation anneal may be performed at a temperature greater than 1000° C.

In some embodiments, $SiH_4$ may be provided in the annealing chamber during the implant anneal along with $NH_3$, in which case, SiN may be deposited on the dielectric layer 24 during the anneal.

In some embodiments, the activation anneal may be performed at a temperature of about 1000° C. to about 1300° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes.

Figure 1C:
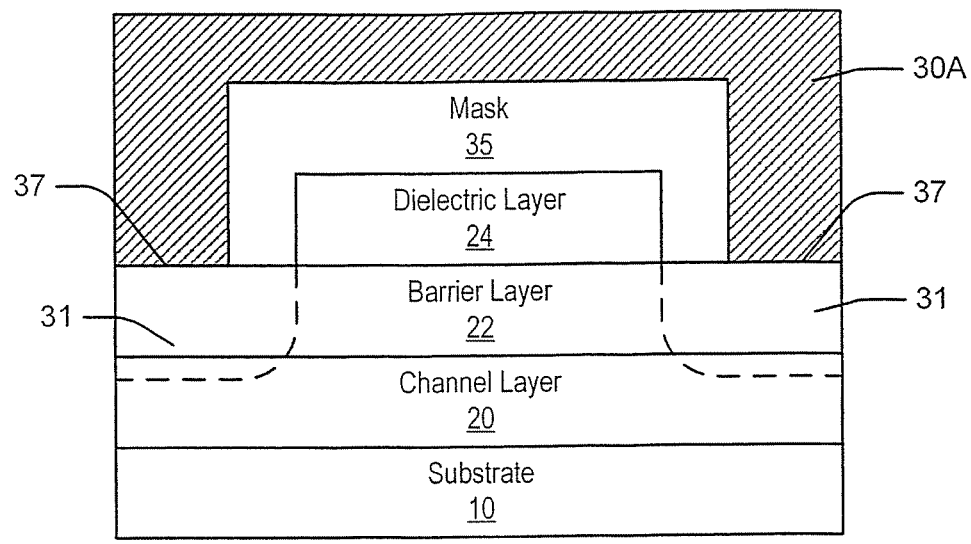

As illustrated in FIG. 1C, a mask 35 is formed on the protective layer, and windows are then opened in the mask 35 over source/drain contact regions 37 for the formation of ohmic contacts. The mask 35 may include $SiO_2$, metal, photoresist or any other suitable mask material. The mask may have a thickness of about 0.1 to about 0.5 μm or more. In particular embodiments, an $SiO_2$ mask can have a thickness of about 0.5 μm, while a metal mask can have a thickness of about 0.4 μm.

Figure 1D:
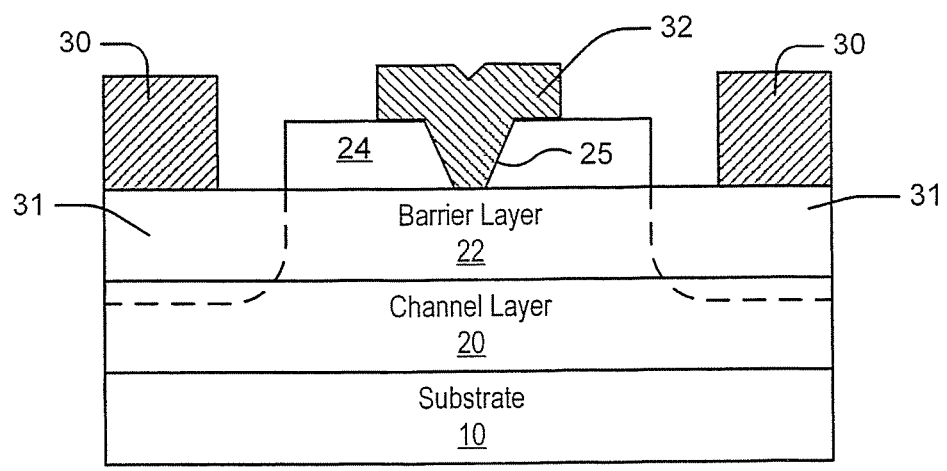

A metal overlayer 30A may then be deposited, for example by evaporation, on the mask 35 and on the portions of the barrier layer 22 exposed by the mask 35 to provide the ohmic contacts 30. Suitable metals may include Ti, Si, Ni, Au, Al, Ta, Mo, TiN, WSiN, and/or Pt. In particular embodiments, the metal overlayer 30A can include a stack of Ti (250 Å), Al (1000 Å) and Ni (500 Å) formed in order on the substrate. The mask 35 may then be lifted off, leaving ohmic contacts 30 on the source drain regions 31 (FIG. 1D).

The edges of the ohmic contacts 30 may be spaced apart laterally on the surface of the barrier layer 22 from the dielectric layer 24 by a distance corresponding to the lateral thickness of the mask 35. For example, the edges of the ohmic contacts 30 may be spaced apart laterally from the dielectric layer 24 by a distance in the range of about 0.1 to about 0.5 μm, and in particular embodiments by about 0.25 μm. The ohmic contacts 30 may be spaced apart from the dielectric layer 24 a distance sufficiently large to allow for misalignment tolerances in the formation and patterning of the ohmic contact metal. If the ohmic contact metal contacts the dielectric layer 24, the metal may diffuse into the dielectric layer 24 during subsequent heating steps, which may result in a short between a gate contact and the ohmic contact(s) 30. However, the gap between the ohmic contacts 30 and the dielectric layer 24 should not be so large as to defeat the protective purpose of the dielectric layer 24 and, thereby, substantially degrade the performance of the device but should not be so small to risk random contact of ohmic material to the protective layer. Thus, for example, in certain embodiments of the present invention, the gap between the ohmic contacts 30 and the dielectric layer 24 may be from about 0.1 μm to about 0.5 μm.

Following metal evaporation, the mask 35 is removed, leaving the ohmic contacts 30 in place.

In some embodiments, the deposited metal may be annealed to reduce the contact resistance of the ohmic contacts 30. The anneal may be a low temperature anneal. For example, the anneal may be an anneal at a temperature less than about 800° C. in an atmosphere of an inert gas such as $N_2$ or Ar. For example, the ohmic contacts 30 may be annealed at a temperature of about 450° C. to about 700° C., and in further embodiments at a temperature of about 570° C. to about 580° C.

Through the use of an ohmic contact anneal, the resistance of the ohmic contacts may be reduced from a relatively high resistance to about 1 Ω-mm or less. Thus, as used herein, the term "ohmic contact" refers to a non-rectifying contact that has a contact resistance of about 1 Ω-mm or less. As with the implant activation anneal, the presence of the dielectric layer 24 during the high temperature process steps may reduce or prevent damage to the barrier layer 22 that may otherwise be caused by such steps. Thus, for example, the sheet resistance of the gate region 21 after the high temperature ohmic contact anneal may be substantially the same as the sheet resistance of the gate region 21 as-grown (i.e. before the contact anneal).

It will be appreciated, however, that due to the presence of the implanted regions 31 as provided above, it may not be necessary to anneal the deposited metal in order to form an ohmic contact thereto. That is, the metal-semiconductor junction may be ohmic as deposited. Since a contact anneal may not be required, it may be acceptable for the metal of the ohmic contacts 30 to contact the dielectric layer 24. Thus, in some embodiments of the invention, a lithography step that may otherwise be required in order to ensure that the ohmic contacts 30 are spaced away from the dielectric layer 24 may be avoided as a result of the implantation of impurities into the barrier layer 22.

In addition, since the ohmic contacts 30 are formed on the implanted regions 31, the ohmic contacts 30 may have a lower resistivity than ohmic contacts formed on non-implanted regions. Thus, the on-resistance of devices formed according to some embodiments of the invention may be lowered.

The formation of low resistance ohmic contacts in GaN HEMTs may help improve the performance of power amplifiers at mm-wave frequencies, as well as other applications that require low on-resistance, including, for example, RF power switches, limiters, and cascode cells. For typical transistor applications, reducing the contact resistance of the device may permit an increase in the drain-source spacing without increasing the on-resistance of the device. Furthermore, the gain and efficiency of microwave devices can be improved through reductions in resistance.

FIG. 1D further illustrates the formation of a gate contact 32. A mask (not shown) is formed on the ohmic contacts 30 and the dielectric layer 24 and patterned to form a window that exposes a portion of the dielectric layer 24. A recess 25 is then formed through the dielectric layer 24 to expose a portion of the barrier layer 22. The recess 25 may be formed using a low damage etch process, such as inductively coupled plasma or electron cyclotron resonance (ECR) or downstream plasma etching with no DC component to the plasma.

In particular embodiments where the ohmic contacts 30 provide source and drain contacts, the recess may be offset between the source and drain contacts such that the recess, and subsequently the gate contact 32, is closer to the source contact than the drain contact.

As seen in FIG. 1D, a gate contact 32 is formed in the recess and contacts the exposed portion of the barrier layer 22. The gate contact may be a "T" gate as illustrated in FIG. 1D and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN. Although it may be undesirable, it is possible that a small gap between the dielectric layer 24 and the gate contact 32 may arise as a result of, for example, anisotropy of the low-damage etch, resulting in an exposed surface of the barrier layer 22 between the dielectric layer 24 and the gate contact 32.

In some embodiments, since the source/drain contacts may not need to be annealed, it may be possible to form the source and drain contacts using the same metal in a single metallization step. For example, Ti, Si, Ni, Au, Al, Ta, Mo, TiN, WSiN, and/or Pt may form an ohmic contact as-deposited on the doped regions 31 of the barrier layer 22 while forming a non-ohmic contact on other portions of the barrier layer 22. A gate metal as described above can endure a thermal budget that includes temperatures as high as 350° C. Thus, while it is possible to form source and drain contacts that are ohmic as-deposited, the thermal processing for subsequent processing of the device can include temperatures that may not negatively affect the gate contact, but that can improve the contact resistance of the source and drain contacts.

Figure 1E:
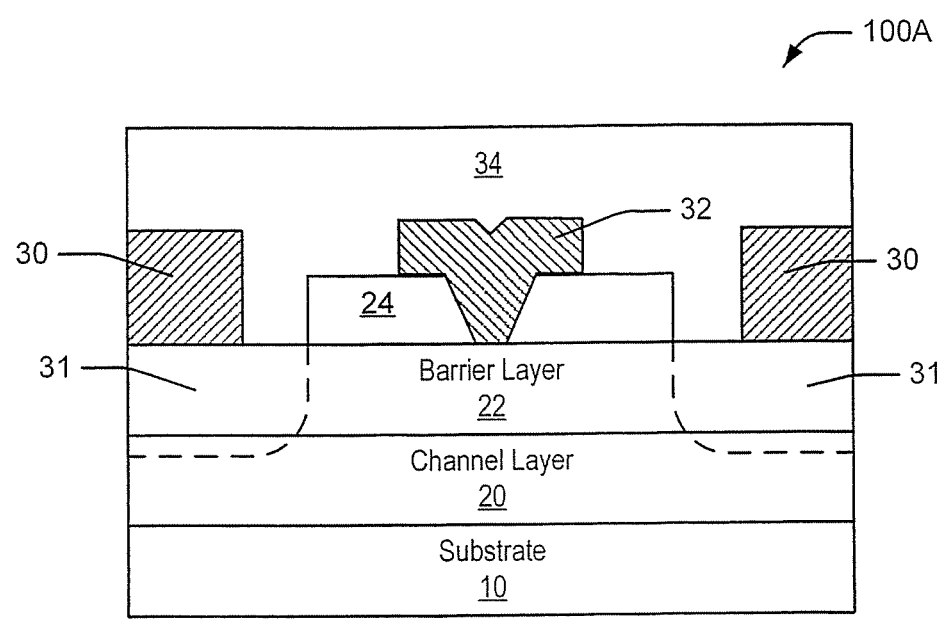

FIG. 1E illustrates a completed device structure 100A including a passivation layer 34. The passivation layer 34 may be blanket deposited on the structure of FIG. 1D. In particular embodiments, the passivation layer 34 is deposited so as to substantially fill the gap between the dielectric layer 24 and the ohmic contacts 30 and also any gap between the dielectric layer 24 and the gate contact 32, if such gap(s) exist. In certain embodiments of the present invention, the passivation layer 34 may include silicon nitride, aluminum nitride, silicon dioxide and/or an oxynitride. Furthermore, the passivation layer 34 may be a single or multiple layers of uniform and/or non-uniform composition.

Figure 2:
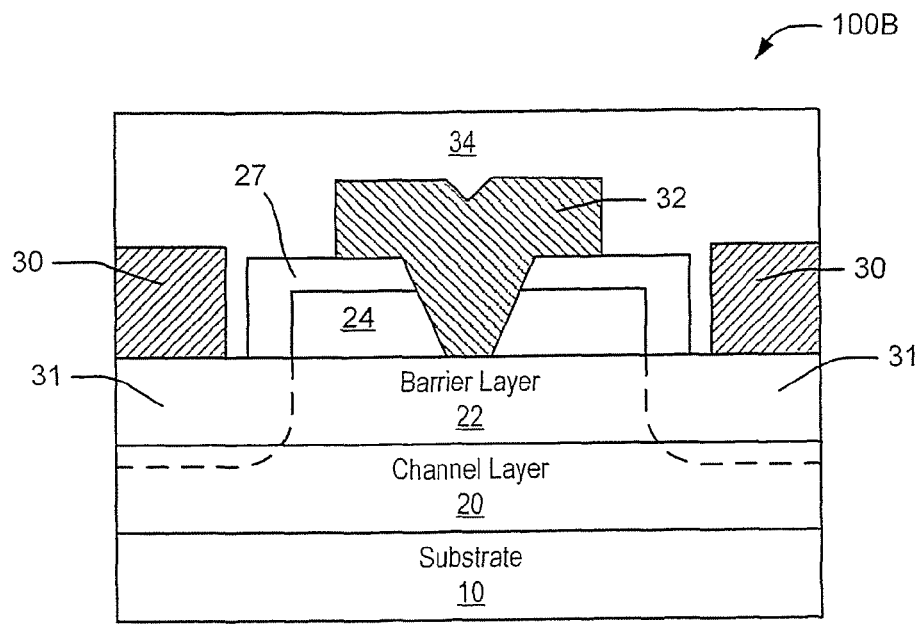
FIGS. 2 and 3 are cross-sectional views illustrating devices according to some embodiments of the invention.
Figure 3:
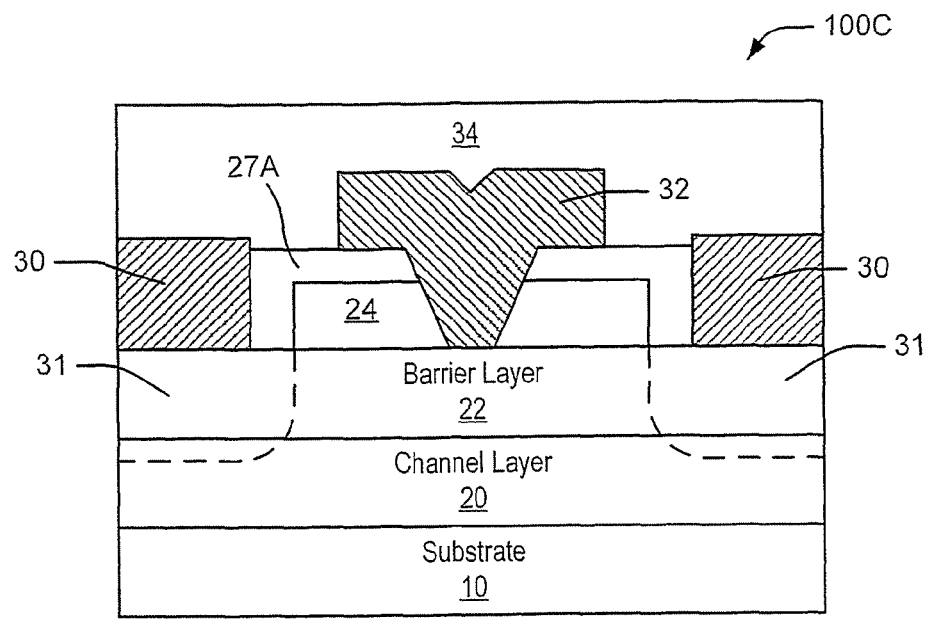

Further embodiments are illustrated in FIGS. 2 and 3. As shown therein, a device structure 100B, 100C according to embodiments of the invention can include a second dielectric layer 27 on the dielectric layer 24. The second dielectric layer 27 can be formed before or after annealing the implanted regions 31 and before formation of the gate contact 32. The second dielectric layer 27 can be fowled of similar materials as the dielectric layer 24, and can include SiN, $SiO_2$, SiON, AlSiN and/or any other suitable dielectric material, and can be provided to protect exposed portions of the implanted source/drain regions 31 during high temperature processing steps. As shown in FIG. 2, the second dielectric layer 27 can be spaced apart laterally from the ohmic contacts 30. In particular, the second dielectric layer 27 can be laterally spaced apart from the ohmic contacts by about 0.25 μm Alternatively, as shown in FIG. 3, the second dielectric layer 27A can be in direct contact with the ohmic contacts 30.

In some embodiments, the second dielectric layer 27 can include the same material as the dielectric layer 24. However, in some embodiments, the second dielectric layer 27 can be formed of a material different from the dielectric layer 24. For example, in some embodiments, the dielectric layer 24 comprises SiN, while the second dielectric layer 27 comprises $SiO_2$, AlSiN and/or SiON.

Figure 4A:
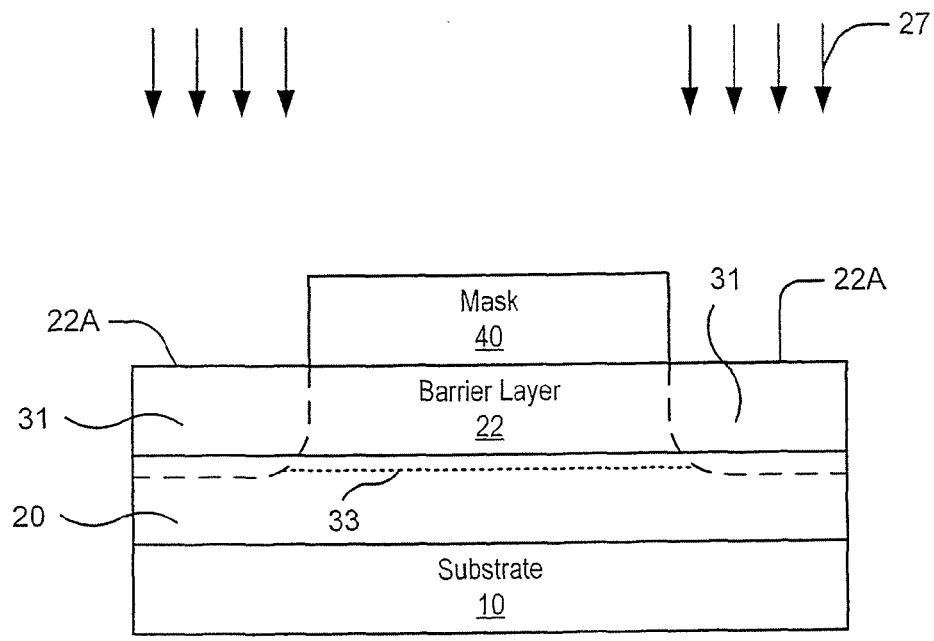
FIGS. 4A and 4B are cross-sectional views illustrating fabrication of a transistor according to further embodiments of the present invention.
Figure 4B:
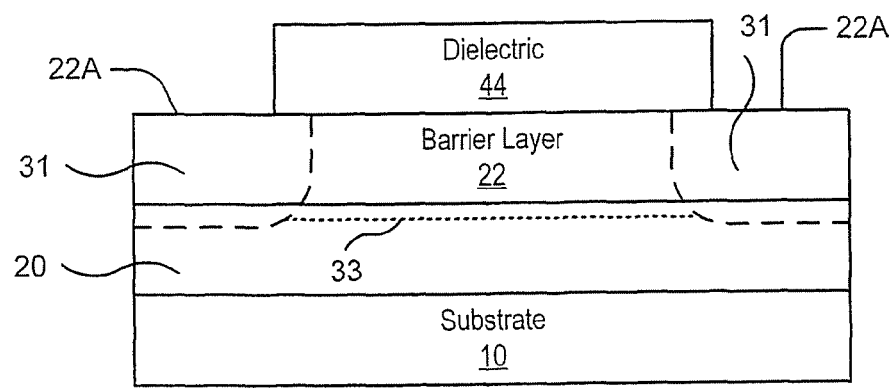

FIGS. 4A and 4B illustrate further embodiments in which a dielectric layer 44 is formed on the barrier layer 22 after implanting the ions 27. Referring to FIG. 4A, a mask 40 is formed on the barrier layer 22. The mask 40 may include a dielectric material such as SiN, $SiO_2$, AlSiN and/or SiON. The dielectric mask 40 is patterned to expose surface areas 22A above the source and drain regions 31 of the device. Impurity ions 27 are implanted into the exposed surfaces 22A to form the implanted source and drain regions 31.

In embodiments in which the mask 40 includes a dielectric material such as SiN, $SiO_2$, AlSiN and/or SiON, the implants may be annealed as described above before removing the mask 40.

Referring to FIG. 4B, the mask 40 is removed, and the dielectric layer 44 is formed on the upper surface of the device structure (e.g. on the barrier layer 22) and patterned to expose at least portions of the source and drain regions 31. The dielectric layer 44 can include, for example, SiN, $SiO_2$, AlSiN and/or SiON. In particular embodiments, the dielectric layer 44 can include deposited SiN. It will be appreciated that it may be desirable to clean the upper surface of the device structure before forming the dielectric layer 44 thereon. The cleaning process may include a fluorine-based clean, such as HF (concentrated for high-purity nitride), a buffered oxide etch (BOE) or a fluorine-based dry etch, such as a dry etch using $CF_4$, $SF_6$, $CHF_3$, etc. An RCA, Ar sputter and/or oxygen plasma cleaning process can also be used.

In some embodiments, the implanted ions may be annealed after formation of the dielectric layer 44 so that the dielectric layer 44 is in place during the anneal. Furthermore, the implanted ions may be annealed before or after patterning the dielectric layer 44 to expose contact regions of the source and drain regions 31.

Embodiments of the invention may allow the use of a lower anneal temperature and/or lower implant energies compared to methods that implant ions through a dielectric layer. Furthermore, the resulting device may have lower channel layer sheet resistance, lower resistance at the interface between the 2DEG region 33 and the implanted source/drain regions 31 and/or lower gate leakage. In some embodiments, the channel layer sheet resistance increase due to subsequent processing steps may be less than about 5%.

Figure 5:
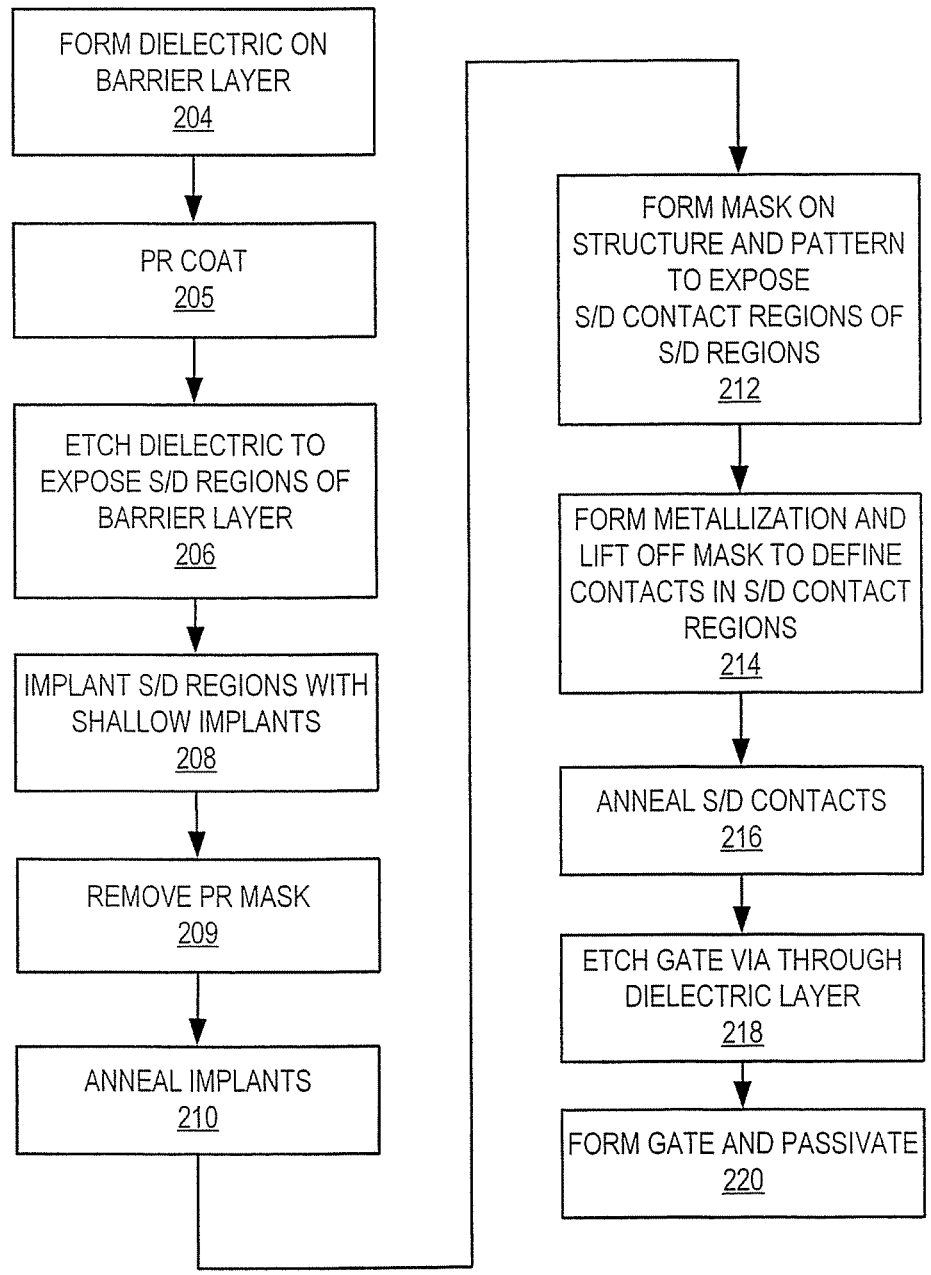
FIGS. 5, 6 and 7 are flowcharts illustrating operations according to some embodiments of the invention.
Figure 6:
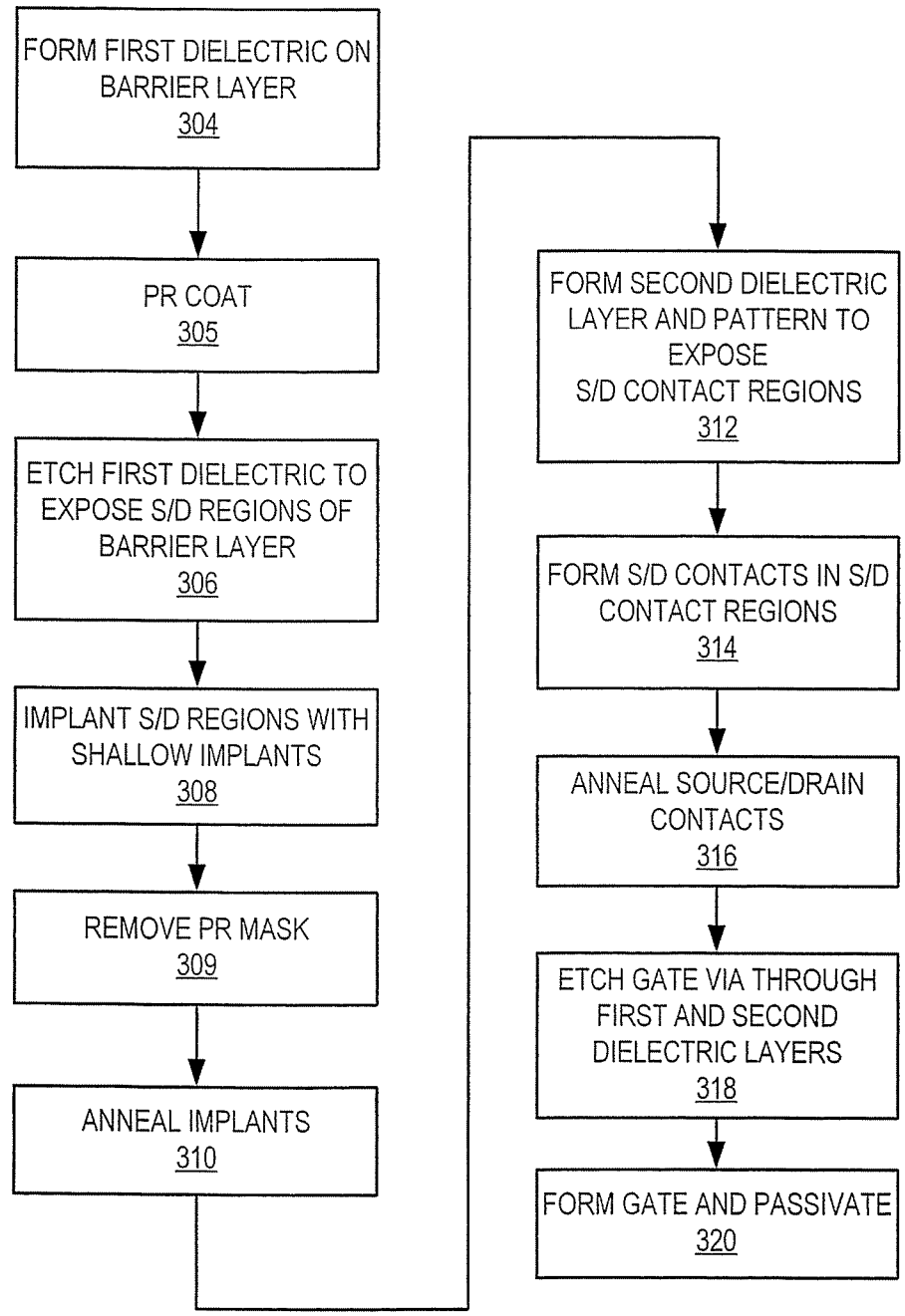
Figure 7:
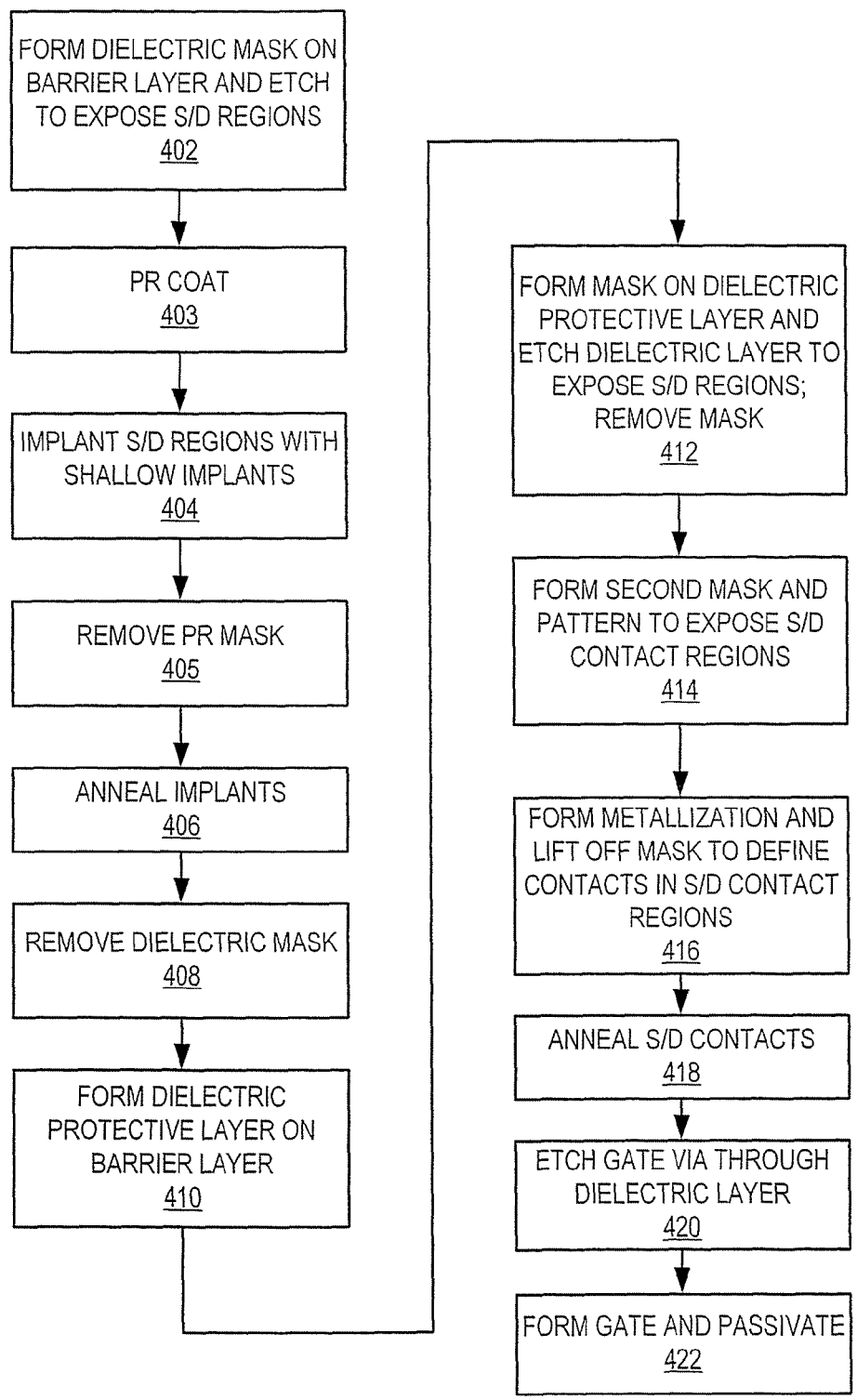

FIGS. 5-7 are flowcharts illustrating operations according to some embodiments of the invention. In particular, FIG. 5 is a flowchart illustrating operations according to some embodiments for forming a device including a single dielectric layer 24 that is formed before implantation of the source/drain regions 31.

Referring to FIG. 5, a dielectric layer 24 is formed on a barrier layer 22 of a GaN-based HEMT structure (Block 204). The wafer is coated with photoresist (Block 205). An etch mask is formed, and the dielectric layer 24 is etched to expose the source/drain regions 31 of the barrier layer 22 (Block 206). The source/drain regions 31 are then implanted with shallow implants (Block 208). The photoresist is then removed (Block 209), and the implanted ions are then annealed for electrical activation (Block 210).

A mask, such as a photoresist mask 35, is then formed on the structure and patterned to expose source/drain contact regions 37 of the source/drain regions 31 (Block 212). Metal is then evaporated onto the structure, and the mask 35 is lifted off to define contacts in the source/drain contact regions 37 (Block 214). The source/drain contacts may then be annealed (Block 216). Next, a gate via 25 is etched through the dielectric layer 24, for example using a photoresist etch mask (Block 218). A gate 32 is then formed in the gate via 25, and the entire structure is passivated with a passivation layer 34 (Block 220).

As discussed above, it may be possible to form the source/drain contacts 30 and the gate contact 32 in the same steps in cases in which the source and drain contacts 30 are ohmic as deposited.

FIG. 6 is a flowchart illustrating operations according to some embodiments for forming a device including a dielectric layer 24 that is formed before implantation of the source/drain regions 31 and a second dielectric layer 27 that is formed after implantation of the source/drain regions 31.

Referring to FIG. 6, a first dielectric layer 24 is foamed on a barrier layer 22 of a GaN-based HEMT structure (Block 304). The wafer is coated with photoresist (Block 305). An etch mask is formed, and the dielectric layer 24 is etched to expose the source/drain regions 31 of the barrier layer 22 (Block 306). The source/drain regions 31 are then implanted with shallow implants (Block 308). The photoresist is then removed (Block 309), and the implanted ions are then annealed for electrical activation (Block 310).

A second dielectric layer 27 is then formed on the structure over the first dielectric layer 27 and the source/drain regions 31 (Block 312). The second dielectric layer 27 is patterned using a photoresist mask to extend onto the source/drain regions 31 and expose at least the source/drain contact regions 37 of the source/drain regions 31. In some embodiments, a separate photolithography step may be performed to deposit and pattern a second photoresist mask to define the source/drain contact regions 37.

Metal is then evaporated onto the structure, and the photoresist mask is lifted off to define contacts in the source/drain contact regions 37 (Block 314). The source/drain contacts may then be annealed (Block 316). Next, a gate via 25 is etched through the dielectric layer 24, for example using a photoresist etch mask (Block 318). A gate 32 is then formed in the gate via 25, and the entire structure is passivated with a passivation layer 34 (Block 320).

FIG. 7 is a flowchart illustrating operations according to some embodiments for forming a device including a single dielectric layer 44 that is Ruined after implantation of the source/drain regions 31.

Referring to FIG. 7, a dielectric implant mask 40 is formed on a barrier layer 22 of a GaN-based HEMT structure (Block 402). The wafer is coated with photoresist (Block 403). The mask is patterned to expose the source/drain regions 31 of the Wilier layer 22. The source/drain regions 31 are then implanted with shallow implants (Block 404). The photoresist is then removed (Block 405), and the implanted ions are then annealed for electrical activation (Block 406).

The dielectric implant mask 40 is removed (Block 408), and a dielectric protective layer 44 is formed on the barrier layer (Block 410).

A mask is then formed on the dielectric layer 44, and the dielectric layer is etched to expose the source/drain regions 31 (Block 412). In some embodiments, the dielectric layer 44 may be etched to expose the source/drain regions 31 before the implanted ions are annealed.

A second mask is formed and patterned to expose the source/drain contact regions 37 of the source/drain regions 31 (Block 414). Metal is then evaporated onto the structure, and the second mask is lifted off to define contacts in the source/drain contact regions 37 (Block 416). The source/drain contacts may then be annealed (Block 418). Next, a gate via 25 is etched through the dielectric layer 44, for example using a photoresist etch mask (Block 420). A gate 32 is then formed in the gate via 25, and the entire structure is passivated with a passivation layer 34 (Block 422).

In the drawings and specification, there have been disclosed typical embodiments of the invention, and, although specific terms have been employed, they have been used in a generic and descriptive sense only and not for purposes of limitation.

That which is claimed is:

1. A method of forming a semiconductor device, comprising:
    providing a dielectric layer on a Group III-nitride semiconductor layer;
    selectively removing portions of the dielectric layer over spaced apart source and drain regions of the semiconductor layer;
    implanting ions having a first conductivity type directly into the source and drain regions of the semiconductor layer wherein an implantation energy is selected to provide a peak implant concentration near a two dimensional electron gas region at an interface of the semiconductor layer and a channel layer underlying the semiconductor layer, wherein the ions are implanted at an implant energy less than about 80 keV;
    after selectively removing the portions of the dielectric layer, annealing the semiconductor layer and the dielectric layer to activate the implanted ions; and
    providing metal contacts on the source and drain regions of the semiconductor layer,
    wherein the peak implant concentration is within about 100 Å of the interface of the semiconductor layer and the channel layer.

2. The method of claim 1, wherein the ions are implanted at a dose of about $8 \times 10^{14}$ ions/cm$^2$ to about $1 \times 10^{16}$ ions/cm$^2$.

3. The method of claim 1, wherein the peak implant concentration is greater than about $1 \times 10^{20}$ cm$^{-3}$.

4. The method of claim 3, wherein the peak implant concentration is greater than about $3 \times 10^{20}$ cm$^{-3}$.

5. The method of claim 1, wherein forming the metal contacts comprises:
    providing a mask over the dielectric layer and the source and drain regions;
    selectively removing portions of the mask to expose respective source and drain contact regions of the source and drain regions;
    depositing a metal on the source and drain contact regions; and
    removing the mask.

6. The method of claim 5, wherein the source and drain contact regions are spaced apart from the dielectric layer by about 0.1 to 1 μm.

7. The method of claim 1, wherein the dielectric layer comprises a first dielectric layer, the method further comprising:
    forming a second dielectric layer over the first dielectric layer after implanting the source and drain regions; and
    selectively removing portions of the second dielectric layer in the source and drain regions to expose respective source and drain contact regions in the source and drain regions.

8. The method of claim 7, further comprising forming source and drain contacts in the source and drain contact regions, wherein the source and drain contacts are in direct contact with the second dielectric layer.

9. The method of claim 7, further comprising forming source and drain contacts in the source and drain contact regions, wherein the source and drain contacts are spaced apart from the second dielectric layer by about 0.1 to about 1 µm.

10. The method of claim 1, further comprising annealing the source and drain contacts at a temperature of about 450° C. to about 700° C.

11. The method of claim 1, wherein the dielectric layer comprises SiN.

12. The method of claim 11 wherein annealing the semiconductor layer and the dielectric layer comprises annealing in an atmosphere containing $NH_3$.

13. The method of claim 11, wherein annealing the semiconductor layer and the dielectric layer comprises annealing at a temperature of from about 1000° C. to about 1300° C.

14. The method of claim 11, wherein annealing the semiconductor layer and the dielectric layer comprises annealing in $NH_3$ and $SiH_4$ so that SiN is formed on the dielectric layer during the anneal.

15. The method of claim 11, wherein forming the dielectric layer comprises forming the dielectric layer using LPCVD or MOCVD at a temperature greater than about 700° C.

16. The method of claim 15, wherein forming the dielectric layer comprises forming the dielectric layer at a temperature of about 900° C. to about 1000° C.

17. The method of claim 1, wherein the dielectric layer comprises a first dielectric layer, the method further comprising:
   removing the first dielectric layer;
   providing a second dielectric layer on the semiconductor layer;
   selectively removing portions of the second dielectric layer over spaced apart source and drain contact regions of the semiconductor layer; and
   forming metal contacts on the source and drain contact regions of the semiconductor layer.

18. The method of claim 17, wherein the source and drain contacts are spaced apart from the second dielectric layer by about 0.1 to 1 µm.

19. The method of claim 17, wherein the second dielectric layer comprises SiN.

20. The method of claim 17, wherein the ions are implanted at an implant energy less than about 80 keV and a dose of about $8 \times 10^{14}$ ions/cm$^2$ to about $1 \times 10^{16}$ ions/cm$^2$.

21. The method of claim 17, wherein forming the metal contacts comprises:
   providing a mask over the second dielectric layer and the source and drain regions;
   selectively removing portions of the mask to expose the source and drain contact regions;
   depositing a metal on the source and drain contact regions; and
   removing the mask.

22. The method of claim 1, wherein removing the portions of the dielectric layer provides a remaining portion of the dielectric layer that exposes portions of the source and drain regions of the semiconductor layer, and
   wherein annealing the semiconductor layer and the dielectric layer comprises annealing the remaining portion of the dielectric layer and the exposed portions of the source and drain regions of the semiconductor layer.

23. The method of claim 1, wherein implanting ions in the semiconductor layer comprises implanting ions at an angle to reduce channeling of the implanted ions.

24. The method of claim 23, wherein the angle is about 7 degrees.

* * * * *

UNITED STATES PATENT AND TRADEMARK OFFICE
CERTIFICATE OF CORRECTION

PATENT NO. : 9,711,633 B2  
APPLICATION NO. : 12/118243  
DATED : July 18, 2017  
INVENTOR(S) : Sheppard et al.

Page 1 of 1

It is certified that error appears in the above-identified patent and that said Letters Patent is hereby corrected as shown below:

In the Specification

Column 4, Line 11: Please correct "about 1 p.m." to read -- about 1 µm. --

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*